United States Patent
Ku et al.

(10) Patent No.: US 10,422,825 B2
(45) Date of Patent: Sep. 24, 2019

(54) DEVICE FOR DETECTING CONNECTOR MOUNTING FAILURE

(71) Applicant: Samsung Electronics Co., Ltd, Gyeonggi-do (KR)

(72) Inventors: Bon-Seok Ku, Gyeonggi-do (KR); Young-Kun Kwon, Gyeonggi-do (KR); Jae-Ryong Han, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 23 days.

(21) Appl. No.: 15/481,371

(22) Filed: Apr. 6, 2017

(65) Prior Publication Data

US 2017/0292985 A1    Oct. 12, 2017

(30) Foreign Application Priority Data

Apr. 6, 2016 (KR) .................. 10-2016-0042458

(51) Int. Cl.
| | |
|---|---|
| *G01R 31/04* | (2006.01) |
| *H01R 13/405* | (2006.01) |
| *H01R 24/64* | (2011.01) |
| *H01R 43/02* | (2006.01) |
| *H01R 107/00* | (2006.01) |

(52) U.S. Cl.
CPC ......... *G01R 31/041* (2013.01); *H01R 13/405* (2013.01); *H01R 24/64* (2013.01); *H01R 43/0256* (2013.01); *H01R 2107/00* (2013.01)

(58) Field of Classification Search
CPC .... G01R 31/041; H01R 13/405; H01R 24/64; H01R 43/0256
See application file for complete search history.

(56) References Cited

U.S. PATENT DOCUMENTS

| | | | | |
|---|---|---|---|---|
| 5,621,811 | A * | 4/1997 | Roder | G01N 23/043 348/126 |
| 6,081,124 | A * | 6/2000 | Chiyoda | G01R 31/045 324/538 |
| 7,478,741 | B1 * | 1/2009 | Newman | B23K 31/12 228/102 |
| 2002/0118031 | A1 * | 8/2002 | Sweeney | G01R 31/025 324/754.03 |
| 2003/0056036 | A1 * | 3/2003 | Carlton | G06F 11/221 710/15 |
| 2007/0072471 | A1 * | 3/2007 | Miyakawa | H01R 43/005 439/274 |
| 2009/0027072 | A1 * | 1/2009 | Feng | G01R 1/0483 324/762.06 |

(Continued)

FOREIGN PATENT DOCUMENTS

| | | |
|---|---|---|
| JP | 2015028471 A | 2/2015 |
| KR | 101486008 B1 | 1/2015 |

*Primary Examiner* — Jermele M Hollington
*Assistant Examiner* — Feba Pothen

(57) ABSTRACT

A device for detecting a connector mounting failure includes a detection unit and a connection member that interconnects the detection unit and a connector device. The connection member includes a connection connector inserted into and seated in the connector device, and a connection line unit that interconnects the connection connector and the detection unit. The connection line unit also delivers a detection value of the connection connector to the detection unit.

11 Claims, 13 Drawing Sheets

(56) References Cited

U.S. PATENT DOCUMENTS

2013/0286189 A1\* 10/2013 Shafie .............. G01N 21/95692
　　　　　　　　　　　　　　　　　　　348/126
2015/0015269 A1\* 1/2015 Schulze ............... G01R 31/048
　　　　　　　　　　　　　　　　　　　324/527

\* cited by examiner

DEVICE FOR DETECTING CONNECTOR MOUNTING FAILURE

CROSS-REFERENCE TO RELATED APPLICATION(S) AND CLAIM OF PRIORITY

The present application is related to and claims the priority under 35 U.S.C. § 119(a) to Korean Application Serial No. 10-2016-0042458, which was filed in the Korean Intellectual Property Office on Apr. 6, 2016, the entire content of which is hereby incorporated by reference.

TECHNICAL FIELD

Various embodiments of the present disclosure relate to a device for detecting a connector mounting failure, for example, a device for detecting a connector mounting failure (hereinafter, referred to as a "connector mounting failure detecting device"), which is capable of detecting a soldering failure of a connector device.

BACKGROUND

An electronic device may be provided with a connector device for supplying a power to the electronic device, or for connecting the electronic device to an external device. Such a connector device may be provided with connector pins to be connected to an external device, and the connector pins may be fixed in an electrically coupled manner by being coupled to a circuit board through a method, such as soldering.

When the connector pins are coupled to the circuit board through a method, such as soldering, a coupling state, a contact failure, and the like of the connector pins are inspected. Such an inspection is carried out by X-ray or via a visual inspection using a microscope.

SUMMARY

When surface mount elements (e.g., the connector pins of a connector device) are coupled to a circuit board to be electrically connected by soldering or the like, the contact state of the surface mount elements (e.g., the state in which the connector pins are in contact with the circuit board) is inspected. For example, a fastening failure is detected by inspecting, e.g., whether any of an insufficient solder failure, a cold solder failure, a crack, a non-solder failure, and the like exists.

As mentioned above, the method of detecting a contact state or a fastening failure of such connector pins is performed by using X-ray or through a visual inspection.

However, when the soldered state of the connector pins on a printed circuit board is detected via visual inspection, it takes a long time to perform the detection, and the accuracy in determining the accuracy of the soldered state is inevitably poor.

Further, when the fastening state is detected by X-ray equipment, setting the detection equipment takes a long time, and the detection equipment, such as the X-ray equipment, is expensive so that a detection cost is inevitably increased.

Further, in order to visually inspect the state where the connector pins are mounted on the circuit board, an opening is drilled at a predetermined position of the connector device, and then the opening is covered with a finishing material, such as a tape, which may increase a cost or the number of assembly steps. Further, an unnecessary opening is inevitably generated in the connector device.

In addition, when the opening is provided to detect the mounting state of the connector pins from the outside, the opening can be subsequently covered. Thus, the opening is inevitably formed to be small in consideration of the housing in which the connector pins are mounted. When the connector pins are formed in two rows, it may be impossible to visually inspect the mounting state of all the connector pins according to the limitation in view of the size of the opening provided for inspecting the connector pins from the outside.

To address the above-discussed deficiencies, it is an object to provide a connector mounting failure detecting device that is capable of automatically detecting the mounting state of a connector through separate equipment.

According to various embodiments of the present disclosure, there is provided a connector mounting failure detecting device. The connector mounting failure detecting device may include a detection unit and a connection member that interconnects the detection unit and a connector device. The connection member may include: a connection connector inserted into and seated in the connector device, and a connection line unit that interconnects the connection connector and the detection unit, and delivers a detection value of the connection connector to the detection unit.

In addition, according to various embodiments of the present disclosure, there is provided a connector mounting failure detecting device that may include a connector seating jig on which the connector device is seated, a detection unit connected to the connector device so as to deliver a signal to the connector device, and a connection member that interconnects the detection unit and the connector device. The connection member may include a connection connector slidably mounted on the connector seating jig and inserted into and electrically connected to the connector device, and a connection line unit that interconnects the connection connector and the detection unit.

The connector mounting failure detecting device according to various embodiments of the present disclosure detects the mounting state of the connector pins on the circuit board through a Voltage Standing Wave Ratio (VSWR). Thus, the mounting state of the connector pins on the circuit board can be correctly detected, and as a result, the reliability concerning the mounting state can be improved.

In addition, the connector mounting failure detecting device according to various embodiments of the present disclosure can perform an inspection even if two or more rows of connector pins are provided, which enables a specialized inspection.

Conventionally, in order to detect a connector mounting failure, it has been necessary to drill a separate opening in the exterior of the connector device in order to allow the visual inspection of the connector device, and it has also been necessary to perform a separate additional process for covering the opening after the completion of the visual inspection. However, the connector mounting failure detecting device of the present disclosure can simplify process steps and reduce the costs because the connector mounting failure detecting device does not require steps of drilling a separate opening and covering the opening, and further, a separate cover member is not needed in the connector mounting failure detecting device.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1A:
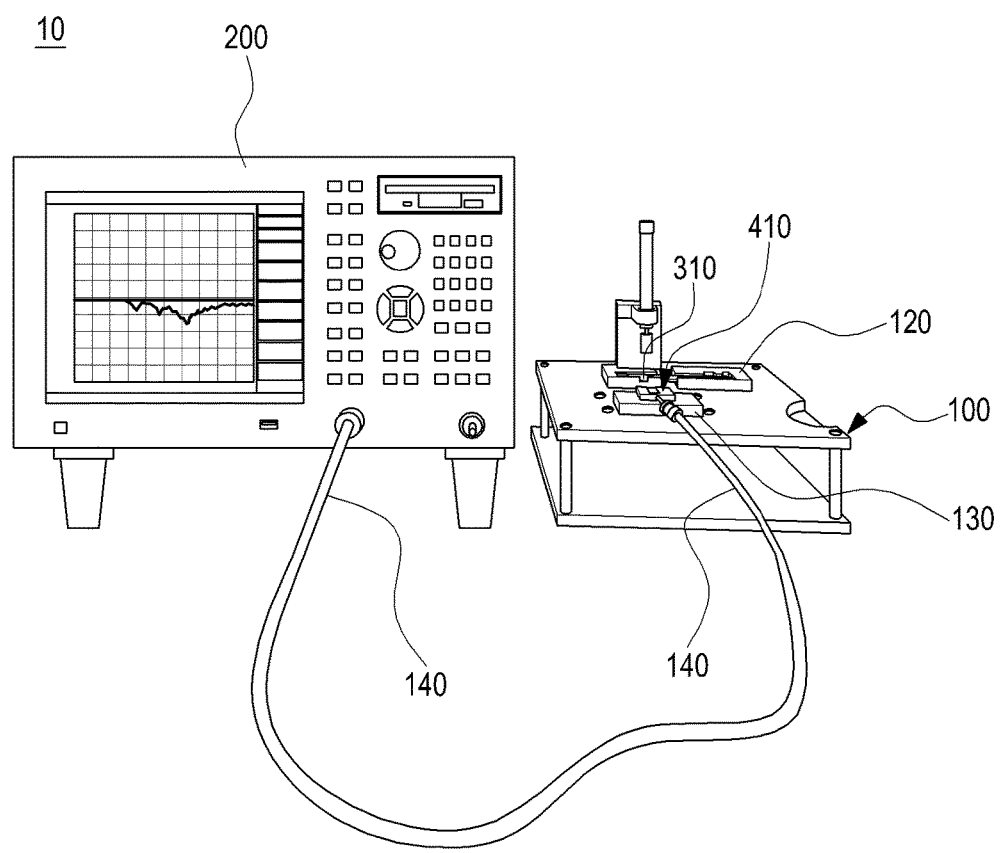
FIG. 1A is a view schematically illustrating a connector mounting failure detecting device according to various embodiments of the present disclosure.

FIGS. 1A through 12B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic device.

Hereinafter, various embodiments of the present disclosure will be described with reference to the accompanying drawings. However, it should be understood that there is no intent to limit the present disclosure to the particular forms disclosed herein; rather, the present disclosure should be construed to cover various modifications, equivalents, and/or alternatives of embodiments of the present disclosure. In describing the drawings, similar reference numerals may be used to designate similar constituent elements.

As used herein, the expression "have", "may have", "include", or "may include" refers to the existence of a corresponding feature (e.g., numeral, function, operation, or constituent element such as component), and does not exclude one or more additional features.

In the present disclosure, the expression "A or B", "at least one of A or/and B", or "one or more of A or/and B" may include all possible combinations of the items listed. For example, the expression "A or B", "at least one of A and B", or "at least one of A or B" refers to all of (1) including at least one A, (2) including at least one B, or (3) including all of at least one A and at least one B.

The expression "a first", "a second", "the first", or "the second" used in various embodiments of the present disclosure may modify various components regardless of the order and/or the importance but does not limit the corresponding components. For example, a first user device and a second user device indicate different user devices although both of them are user devices. For example, a first element may be termed a second element, and similarly, a second element may be termed a first element without departing from the scope of the present disclosure.

It should be understood that when an element (e.g., first element) is referred to as being (operatively or communicatively) "connected," or "coupled," to another element (e.g., second element), it may be directly connected or coupled directly to the other element or any other element (e.g., third element) may be interposer between them. In contrast, it may be understood that when an element (e.g., first element) is referred to as being "directly connected," or "directly coupled" to another element (second element), there are no element (e.g., third element) interposed between them.

The expression "configured to" used in the present disclosure may be exchanged with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a generic-purpose processor (e.g., central processing unit (CPU) or application processor (AP)) that can perform the corresponding operations by executing one or more software programs stored in a memory device.

The terms used herein are merely for the purpose of describing particular embodiments and are not intended to limit the scope of other embodiments. As used herein, singular forms may include plural forms as well unless the context clearly indicates otherwise. Unless defined otherwise, all terms used herein, including technical and scientific terms, have the same meaning as those commonly understood by a person skilled in the art to which the present disclosure pertains. Such terms as those defined in a generally used dictionary may be interpreted to have the meanings equal to the contextual meanings in the relevant field of art, and are not to be interpreted to have ideal or excessively formal meanings unless clearly defined in the present disclosure. In some cases, even the term defined in the present disclosure should not be interpreted to exclude embodiments of the present disclosure.

An electronic device according to various embodiments of the present disclosure may include at least one of, for example, a smart phone, a tablet Personal Computer (PC), a mobile phone, a video phone, an electronic book reader (e-book reader), a desktop PC, a laptop PC, a netbook computer, a workstation, a server, a Personal Digital Assistant (PDA), a Portable Multimedia Player (PMP), a MPEG-1 audio layer-3 (MP3) player, a mobile medical device, a camera, and a wearable device. According to various embodiments, the wearable device may include at least one of an accessory type (e.g., a watch, a ring, a bracelet, an anklet, a necklace, a glasses, a contact lens, or a Head-Mounted Device (HMD)), a fabric or clothing integrated type (e.g., an electronic clothing), a body-mounted type (e.g., a skin pad, or tattoo), and a bio-implantable type (e.g., an implantable circuit).

According to some embodiments, the electronic device may be a home appliance. The home appliance may include at least one of, for example, a television, a Digital Video Disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

According to another embodiment, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a Vehicle Infotainment Devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.).

According to some embodiments, the electronic device may include at least one of a part of furniture or a building/structure, an electronic board, an electronic signature receiving device, a projector, and various kinds of measuring instruments (e.g., a water meter, an electric meter, a gas meter, and a radio wave meter). In various embodiments, the electronic device may be a combination of one or more of the aforementioned various devices. According to some embodiments, the electronic device may also be a flexible device. Further, the electronic device according to an embodiment of the present disclosure is not limited to the aforementioned devices, and may include a new electronic device according to the development of technology.

FIG. 1A is a view schematically illustrating a connector mounting failure detecting device 10 according to various embodiments of the present disclosure.

Figure 1B:
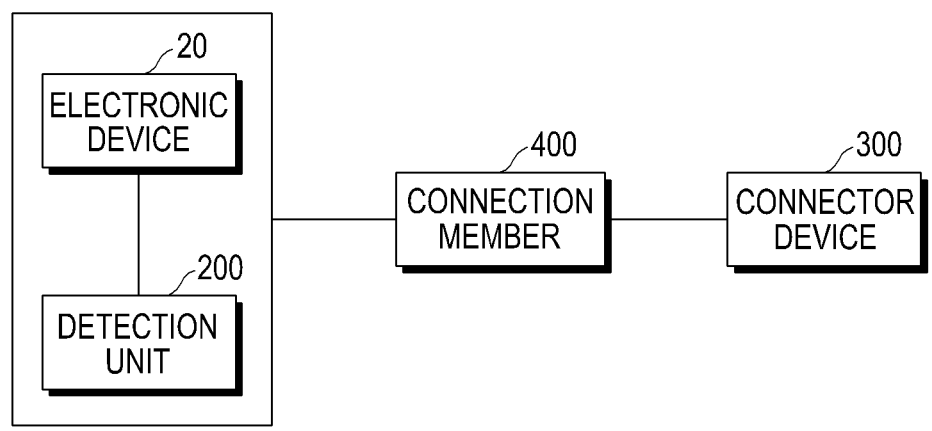
FIG. 1B is a block diagram illustrating a schematic connection of the connector mounting failure detecting device according to various embodiments of the present disclosure.

FIG. 1B is a block diagram illustrating a schematic connection of the connector mounting failure detecting device 10 according to various embodiments of the present disclosure.

Figure 2:
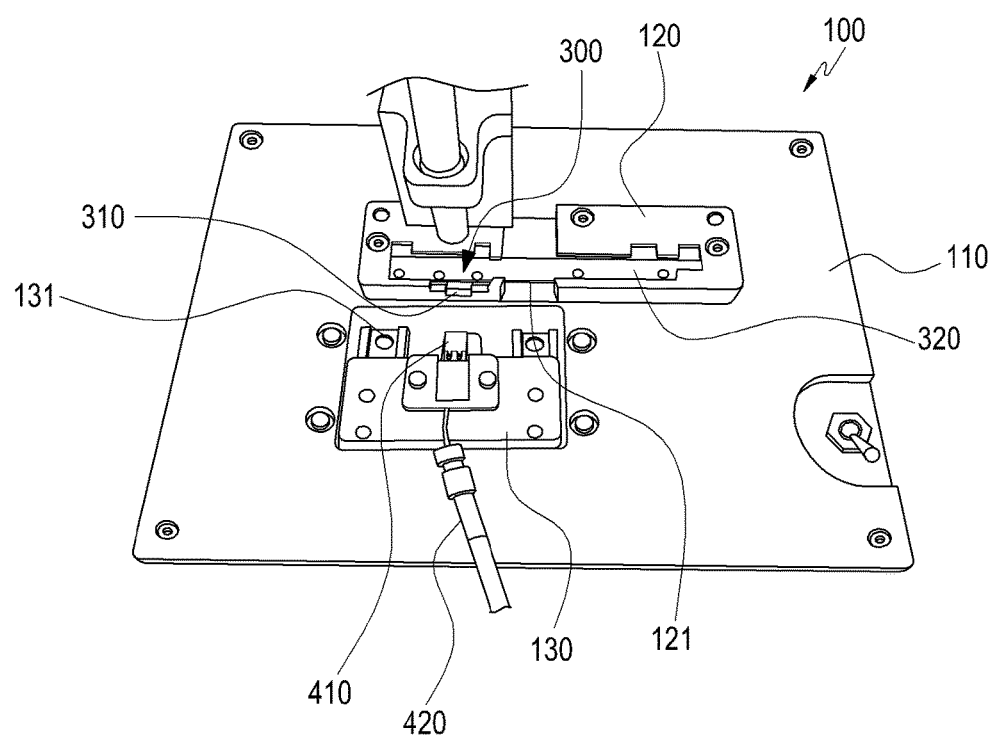
FIG. 2 is a view schematically illustrating a seating jig of the connector mounting failure detecting device according to various embodiments of the present disclosure.

FIG. 2 is a view schematically illustrating a seating jig 100 of the connector mounting failure detecting device 10 according to various embodiments of the present disclosure.

Figure 3:
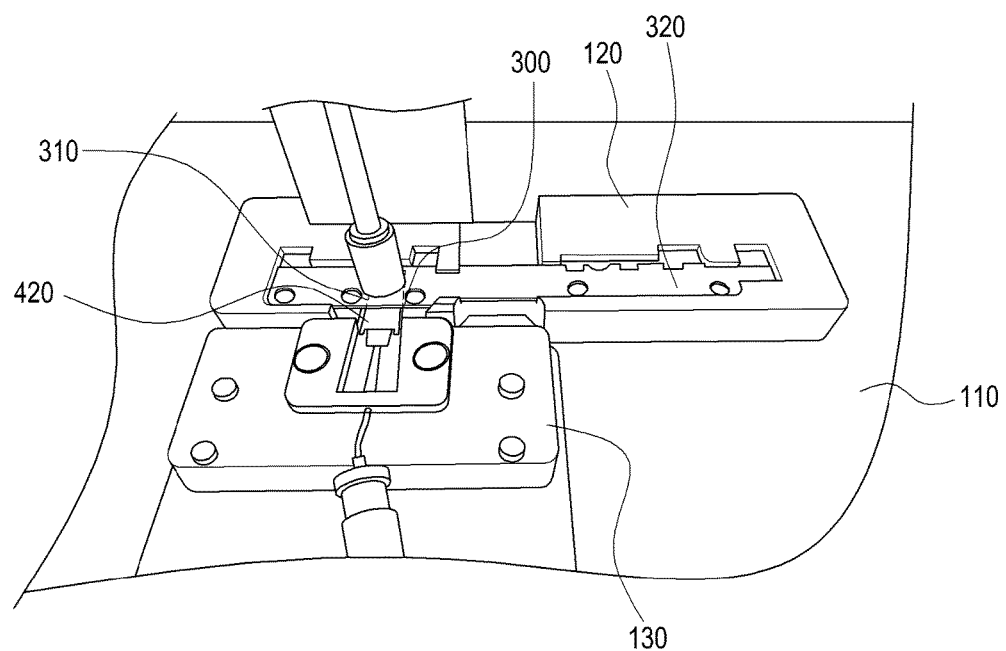
FIG. 3 is a view schematically illustrating a state in which a connector device and a connection connector are connected to each other in the connector mounting failure detecting device according to various embodiments of the present disclosure.

FIG. 3 is a view schematically illustrating a state in which a connector device 300 and a connection connector 420 are connected to each other in the connector mounting failure detecting device 10 according to various embodiments of the present disclosure.

Figure 4:
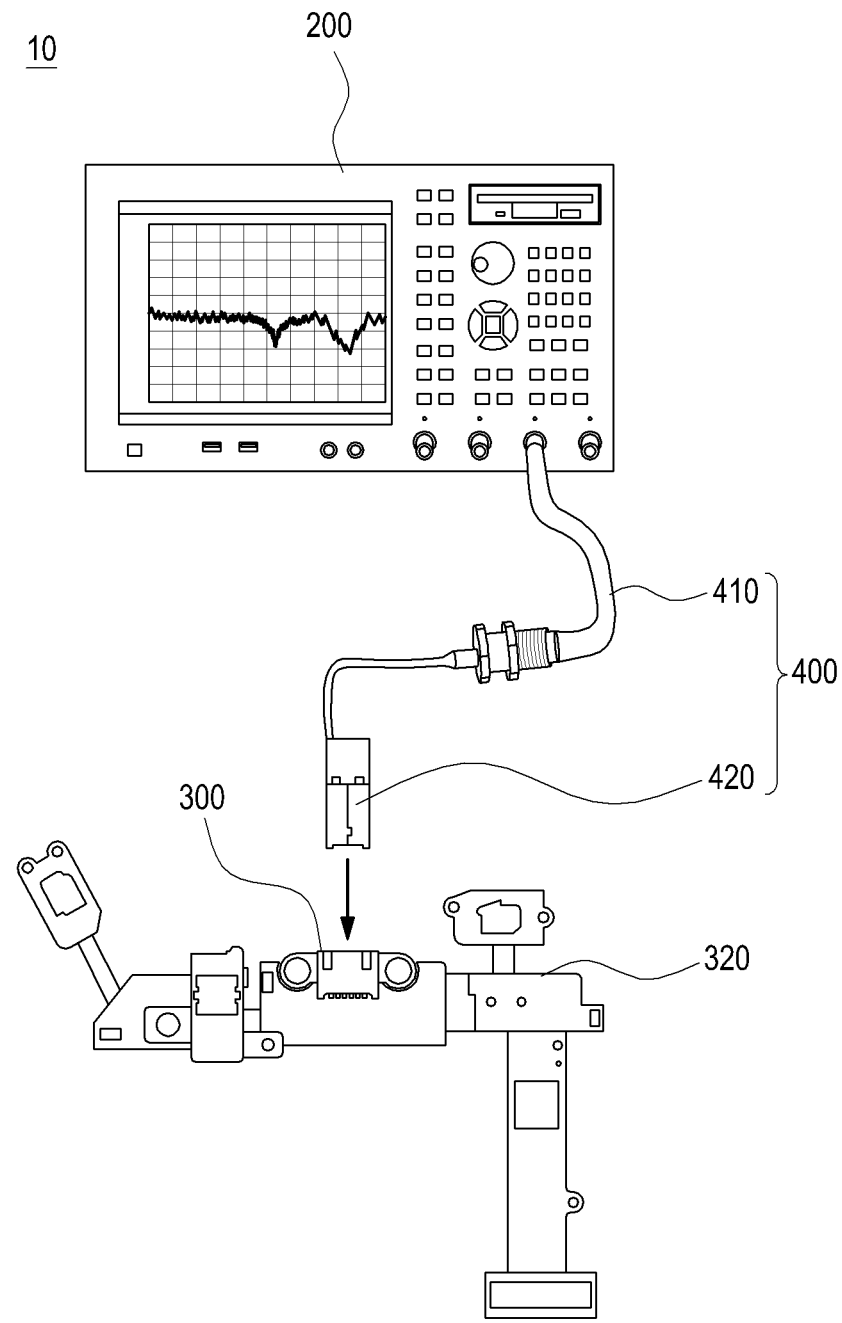
FIG. 4 is a view schematically illustrating a state in which a detection unit and a connector device are connected to each other in the connector mounting failure detecting device according to various embodiments of the present disclosure.

FIG. 4 is a view schematically illustrating a state in which a detection unit 200 and a connector device 300 are connected to each other in the connector mounting failure detecting device 10 according to various embodiments of the present disclosure.

Referring to FIGS. 1 to 4, according to various embodiments of the present disclosure, the connector mounting failure detecting device 10 may include a seating jig 100, a detection unit 200, and a connection member 400.

The seating jig 100 may be disposed adjacent to the detection unit 200, and may be provided such that the connector device 300 is seated thereon.

The seating jig 100 may include a jig body 110, a connector fixing unit 120, and a sliding fixing unit 130.

The jig body 110 may be disposed adjacent to the detection unit 200. On the top side thereof, the jig body 110 may include the connector fixing unit 120 that fixes the connector device 300, and a configuration to be electrically connected to the connector device 300, specifically, the sliding fixing unit 130 on which the connection connector 420 can be seated that delivers a signal to the detection unit 200 according to the coupling state of connector pins 310.

The connector fixing unit 120 may be disposed on one surface of the jig body 110, and may be provided to fix the connector device 300 thereto. The connector fixing unit 120 may be provided to fix the connector device 300 to the jig body 110 such that a soldering failure between the connector pins 310 and a circuit board 320 can be detected in a state where the connector device 300 (specifically, the connector pins 310) is surface mounted on the circuit board 320 by soldering or the like.

The connector fixing unit 120 may be provided to protrude upward from one surface of the jig body 110, and the connector fixing unit 120 may be provided with a seating recess 121 inside a surface thereof, which faces the sliding fixing unit 130 in the state where the protrude upward from the connector fixing portion 120. Thus, when the slide fixing unit 130 to be described later moves toward the connector fixing unit 120, a stopper protrusion 131 of the sliding fixing unit 130 is inserted into the seating recess 121 of the connector fixing unit 120 such that the connector device 300 and the connection connector 420 can be coupled to each other and the movement of the sliding fixing unit 130 can be restricted.

The sliding fixing unit 130 may be disposed on one surface of the jig body 110, and may be provided to be slidably moved toward the connector fixing unit 120 side to be adjacent to the connector fixing unit 120. The connection connector 420 of the connection member 400 described later may be fixed to the sliding fixing unit 130. The connection connector 420 may protrude to the connector fixing unit 120 side from the sliding fixing unit 130 such that, when the sliding fixing unit 130 is moved to the connector fixing unit 120 side to be engaged with the connector fixing unit 120, the connection connector 420 protruding from the sliding fixing unit 130 can be inserted into and electrically connected to the connector device 300.

The sliding fixing unit 130 may be provided with the stopper protrusion 131 to protrude in the sliding movement direction therefrom, and according to one embodiment, the stopper protrusion 131 may be provided on either side of the connection connector 420.

The sliding fixing unit 130 of the present disclosure may be provided on the jig body 110 such that the sliding fixing unit 130 protrudes upward from the jig body 110 and is slid toward the connector fixing unit 120 in the protruded state. However, the structure or configuration of the sliding fixing unit 130 is not limited to the above-described one, and may be changed or modified as long as the sliding fixing unit 130 is configured such that the sliding fixing unit 130 can be moved to the connector fixing portion 120 such that the connection connector 420 comes in electric contact with the connector device 300.

As described above, when the stopper protrusion 131 is seated in the seating recess 121, the connection connector 420 can be electrically connected to the connector device 300.

The detection unit 200 may be provided such that the detection unit 200 is disposed adjacent to the seating jig 100 and electrically connected to the connector device 300 placed on the seating jig 100 to be capable of detecting a soldering failure when the connector device 300 (specifically the connector pins 310) is soldered to the circuit board 320.

The detection unit 200 may be provided such that, in the state where the detection unit 200 electrically is coupled to the connector device 300, specifically through a connection line unit 410, the detection unit 200 is capable of detecting a mounting failure by comparing a measured waveform of a signal that is incident on the connector device 300 and then returns to the detection unit 200 through the connection member 400 with a set reference waveform. That is, when the connector pins 310 are soldered to the circuit board 320 without a failure, the detection unit 200 can indicate reference waveforms of the respective connector pins according to an electric connection in accordance with no electric failure. In this state, when the connection connector 420 and the connector device 300 are connected to each other, detection waveforms of signals, which are generated in the detection unit 200, are incident on the connector device 300, and then return to the detection unit 200 through the connection member 400, can be indicated on the detection unit 200. Accordingly, the detection unit 200 compares the reference waveforms with the measurement waveforms, and when the reference waveforms correspond to the detection waveforms, the detection unit 200 can confirm that the connector pins 310 are normally soldered to the circuit board 320. Unlike this, when at least a portion of at least one of the measured waveforms does not correspond to the reference waveforms, it can be confirmed that the connector pins 310 are fastened to the circuit board 320 with at least one of, for example, a cold solder failure, an insufficient solder failure, a lead bent failure, a crack, and an open failure.

In FIG. 1A, the detection unit 200 has been described as an example of network equipment, but the present disclosure is not limited thereto. According to one embodiment, the detection unit 200 may be provided as one module of an electronic device 20 such as a computer or a portable device, such that the mounting state of the connector device 300 can be detected when the electronic device 20 is connected to the connector device 300 through the connection member 400. In addition, the detection unit 200 may be provided separately from the electronic device 20 and may be electrically connected to the electronic device 20 to detect the mounting state of the connector device 300.

The detection unit 200 may be an electronic device, such as a network device, a computer, or a portable electronic device, and may be connected to the connector device 300 through the connection member 400 to detect the mounting state of the connector device 300.

The connection member 400 is a component for connecting the detection unit 200 and the connector device 300 to each other, and may include a connection connector 420 and a connection line unit 410.

The connection connector 420 may be provided such that the connection connector 420 is fixed on the sliding fixing part 130 and is moved toward the connector device 300 fixed to the connector fixing unit 120 according to the sliding movement of the sliding fixing unit 130 so as to be electrically connected to the connector device 300.

The connection connector 420 may be fixed the connector fixing unit 120 at one end of the sliding fixing unit 130 to protrude toward the connector fixing unit 120, i.e., toward the connector device 300 fixed to the connector fixing unit 120.

The connection line unit 410 may be provided to connect the connection connector 420 and the detection unit 200 to each other and to transmit a detection value of the connection connector 420 to the detection unit 200. That is, one end of the connecting line unit 410 may be provided in the detection unit 200, and the other end of the connecting line unit 410 may be provided with the connection connector 420 to be inserted into/pulled out from the connector device 300.

Figure 5A:
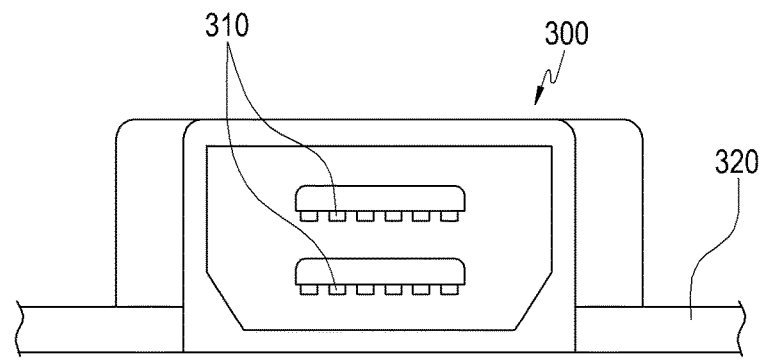
FIG. 5A is a view schematically illustrating a connector device in the connector mounting failure detecting device according to various embodiments of the present disclosure.
Figure 5B:
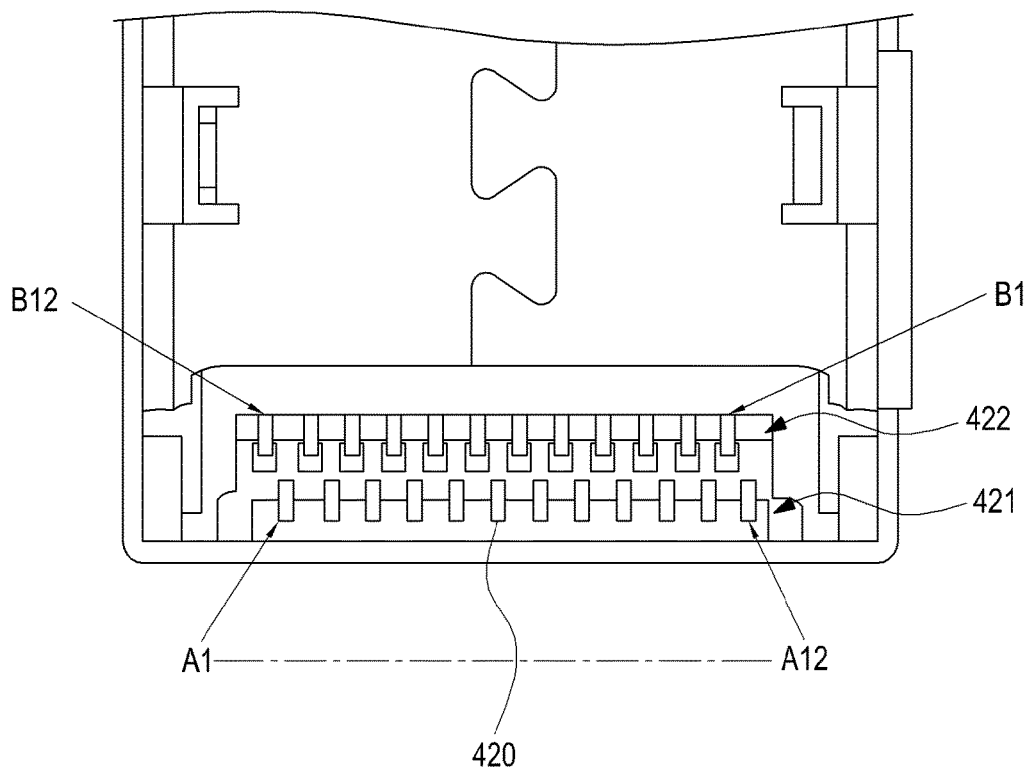
FIG. 5B is a view schematically illustrating a connection connector in the connector mounting failure detecting device according to various embodiments of the present disclosure.
Figure 5C:
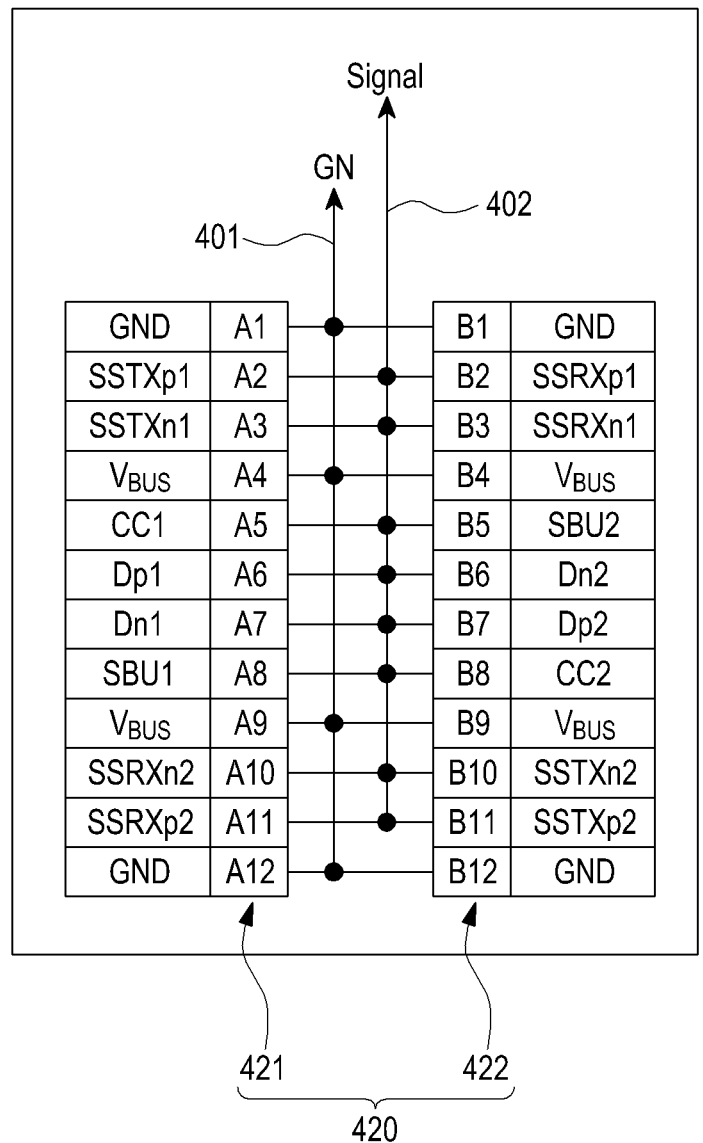
FIG. 5C is a view schematically illustrating a connection wiring of the pins of the connection connector in the connector mounting failure detecting device according to various embodiments of the present disclosure.

FIG. 5A is a view schematically illustrating the connector device 300 in a connector mounting failure detecting device 10 according to various embodiments of the present disclosure. FIG. 5B is a view schematically illustrating the connection connector 420 in the connector mounting failure detecting device 10 according to various embodiments of the present disclosure. FIG. 5C is a view schematically illustrating a connection wiring of pins of the connection connector 420 in the connector mounting failure detecting device 10 according to various embodiments of the present disclosure.

Referring to FIGS. 5A to 5C, it may be described that the connector device 300 (see FIGS. 1 to 4) according to an embodiment is a USB type C connector by way of an example. However, the connector device 300 is not limited thereto, but may be changed or modified as long as it is configured to be connectable to an electronic device, and to be coupled to the circuit board 320 through surface mounting.

The connector device 300 may include connector pins 310 and a circuit board 320 to which the connector pins 310 are electrically coupled through surface mounting including, for example, soldering. As described above, the detection unit 200 may be provided to detect the coupled state of soldering when the connector pins 310 are soldered to the circuit board 320.

The connector device 300 may include two rows of connector pins including a first row of twelve (12) connector pins 310 and a second row of connector pins located adjacent to the first row of connector pins and including twelve connector pins 310. Thus, the connection connector 420 may include a first row of pins 421 connected to the first row of connector pins of connector device 300 and a second row of pins 422 connected to the second row of connector pins. The pins 420 may be provided to be connected to the connector pins 310 of the connector device 300 so as to detect a soldering failure of the connector pins 310.

Each of the pins 421 (A1 to A12) and 422 (B1 to B12) of the connection connector 420 including the two rows of pins 421 and 422 according to one embodiment may be provided to have a ground function, a power supply function, and a signal function.

For example, the first row of connector pins 421 may include two pins A1 and A12 for ground and two pins A4 and A9 for power supply, and the pins A2, A3, A5 to A8, A10, and A11 other than the pins A1, A12, A4, and A9 may be provided for signals.

Likewise, the second row of connector pins 422 may include two pins B1 and B12 for implementing ground and two pins B4 and B9 for implementing power supply, and the pins B2, B3, B5 to B8, B10, and B11 other than the pins B1, B12, B4, and B9 may be provided for implementing signals.

According to one embodiment of the present disclosure, in the connection wiring state of the connection connector 420 including two rows of pins 421 and 422 (see FIG. 5B), a first line 401, which is provided with both a ground and a power supply line, and a second line 402, which delivers a signal, may be included. The first line 401 is a wiring that is electrically connected to both the pins A1-B12, A4-B9, A9-B4, and A12-B1 for implementing a ground and a power supply, which may be wired to be electrically provided together. The second line 402 is a wiring that is provided to connect pins A2-B11, A3-B10, A5-B8, A6-B7, A7-B6, A8-B5, A10-B3, and A11-B2 for implementing a signal.

That is, in the connector pins 421 and 422, the pins A1-B12 and A12-B1 for implementing a ground and the pins A4-B9 and A9-B4 for implementing a power supply may be connected together, and may be connected to the first line 401 for a ground and a power supply, and the pins A2-B11, A3-B10, A5-B8, A6-B7, A7-B6, A8-B5, A10-B3, and A11-B2 for implementing a signal may be connected to a second line 402 for a signal.

Figure 6:
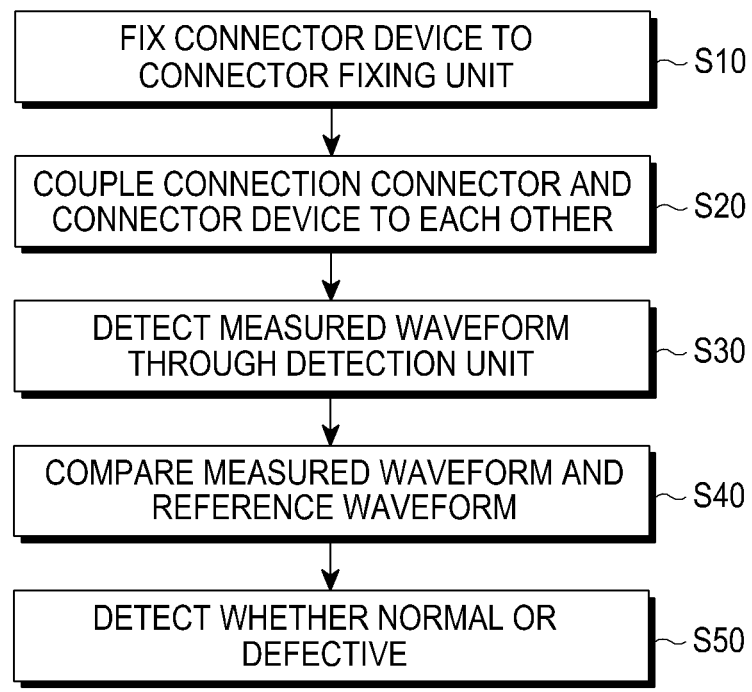
FIG. 6 is a block diagram schematically illustrating a step of detecting a failure of the connector device by the connector mounting failure detecting device according to various embodiments of the present disclosure.

FIG. 6 is a block diagram schematically illustrating a step of detecting a failure of the connector device 300 by the connector mounting failure detecting device 10 according to various embodiments of the present disclosure.

Referring to FIG. 6, the connector device 300 may be fixed to the connector fixing unit 120 of the jig body 110. In addition, the connection connector 420 provided at the other end of the connection line unit 410 can be fixed to the sliding fixing unit 130 of the jig body 110 (S10).

In this state, when the sliding fixing unit 130 is moved toward the connector fixing unit 120, the stopper protrusion 131 protruding from one end of the sliding fixing unit 130 can be inserted into the seating recess 121 of the connector fixing unit 120. The connection connector 420 protruding from the one end of the sliding fixing part 130 toward the connector device 300 can be inserted into the connector device 300. Thus, the connection connector 420 and the connector device 300 can be electrically connected to each other (S20). The detection unit 200 can generate signals so as to detect a soldering failure (S30), and the generated signals are incident on the connector device 300 and return to the detection unit 200 through the connection line unit 410 that interconnects the connection connector 420 and the connector device 300, so that measured waveforms can be detected by measuring the returned signals (S40). When the measured waveforms and the reference waveforms are compared with each other, it is possible to detect whether the connection state of the connector device is normal or defective (S50).

That is, the detection unit 200 can detect whether the connector pins 310 of the connector device 300 are normally coupled to the circuit board 320 by detecting the measurement waveforms and the reference waveforms.

Figure 7:
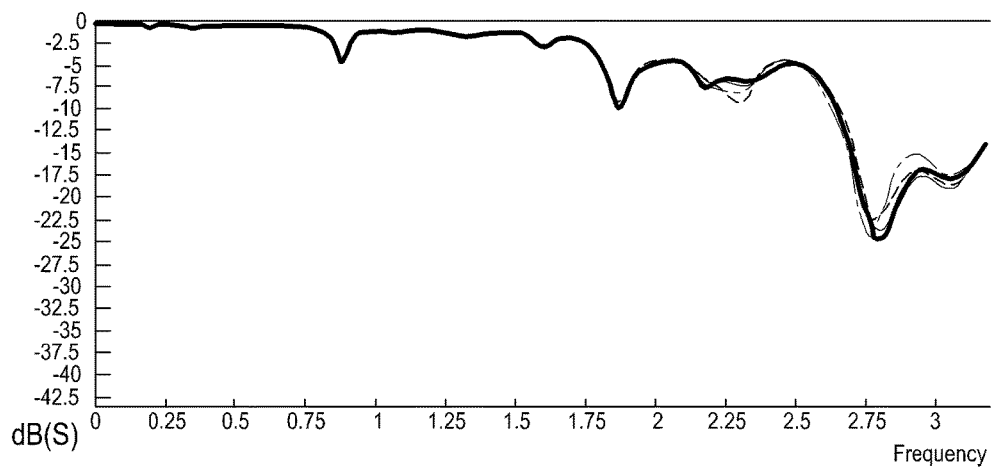
FIG. 7 is a graph representing reference waveforms according to a normal connection, which is generated by the connector mounting failure detecting device according to various embodiments of the present disclosure.

FIG. 7 is a graph representing reference waveforms according to a normal connection, which is generated by the connector mounting failure detecting device 10 according to various embodiments of the present disclosure.

Figure 8:
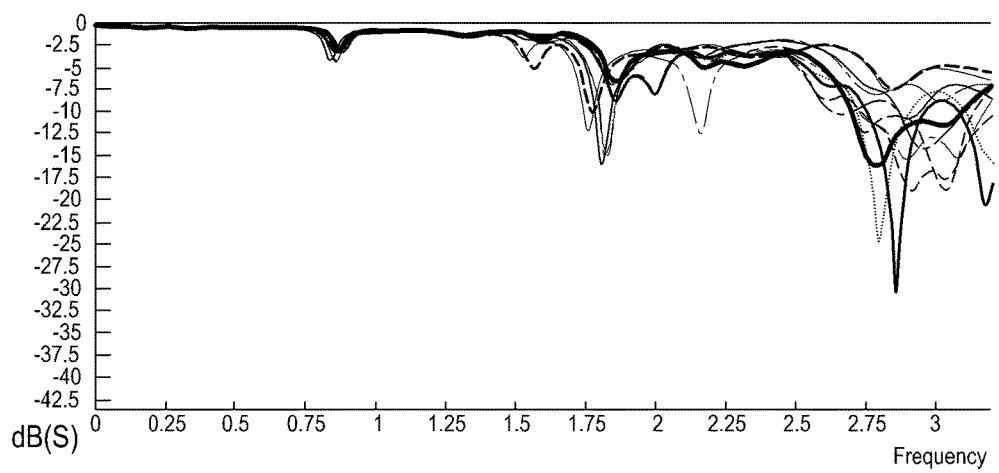
FIG. 8 is a view representing, in comparison with the reference waveforms, waveforms measured by the detection unit in the connector mounting failure detecting device according to various embodiments of the present disclosure when a lead bending failure is generated in a connector device.

FIG. 8 is a view representing, in comparison with the reference waveforms of, waveforms measured by the detection unit 200 in the connector mounting failure detecting device 10 according to various embodiments of the present disclosure when a lead bending failure is generated in a connector device 300.

Figure 9:
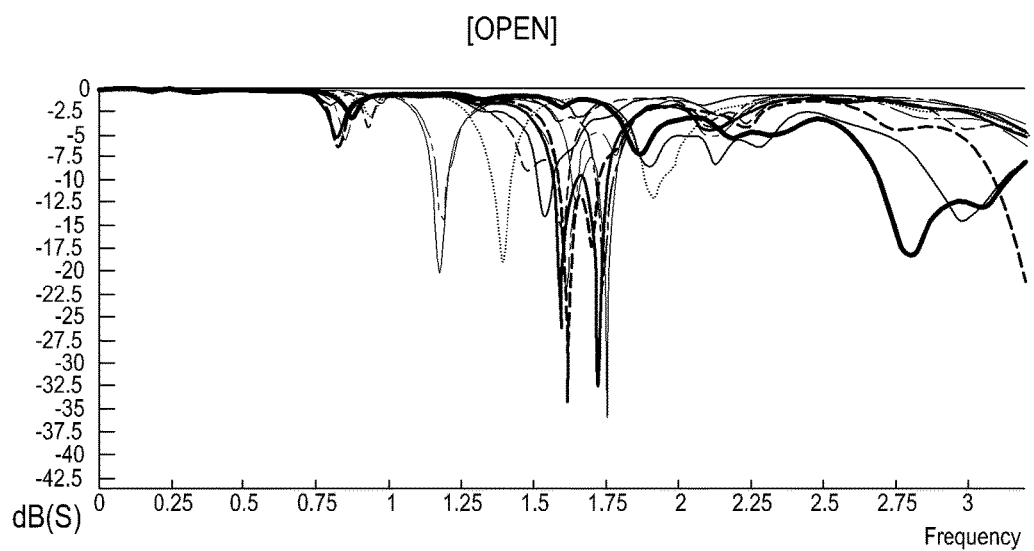
FIG. 9 is a view representing, in comparison with the reference waveforms, waveforms measured by the detection unit in the connector mounting failure detecting device according to various embodiments of the present disclosure when an open failure is generated in a connector device.

FIG. 9 is a view representing, in comparison with the reference waveforms of FIG. 7, waveforms measured by the detection unit 200 in the connector mounting failure detecting device 10 according to various embodiments of the present disclosure when an open failure is generated in a connector device 300.

Figure 10:
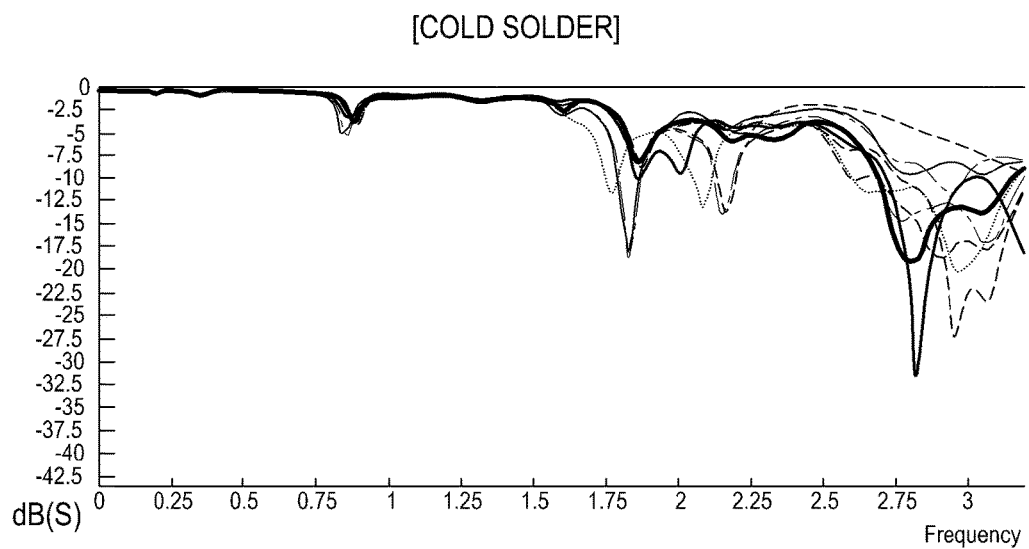
FIG. 10 is a view representing, in comparison with the reference waveforms, waveforms measured by the detection unit in the connector mounting failure detecting device according to various embodiments of the present disclosure when a cold solder failure is generated in a connector device.

FIG. 10 is a view representing, in comparison with the reference waveforms of FIG. 7, waveforms measured by the detection unit 200 in the connector mounting failure detecting device 10 according to various embodiments of the present disclosure when a cold solder failure is generated in a connector device 300.

Figure 11:
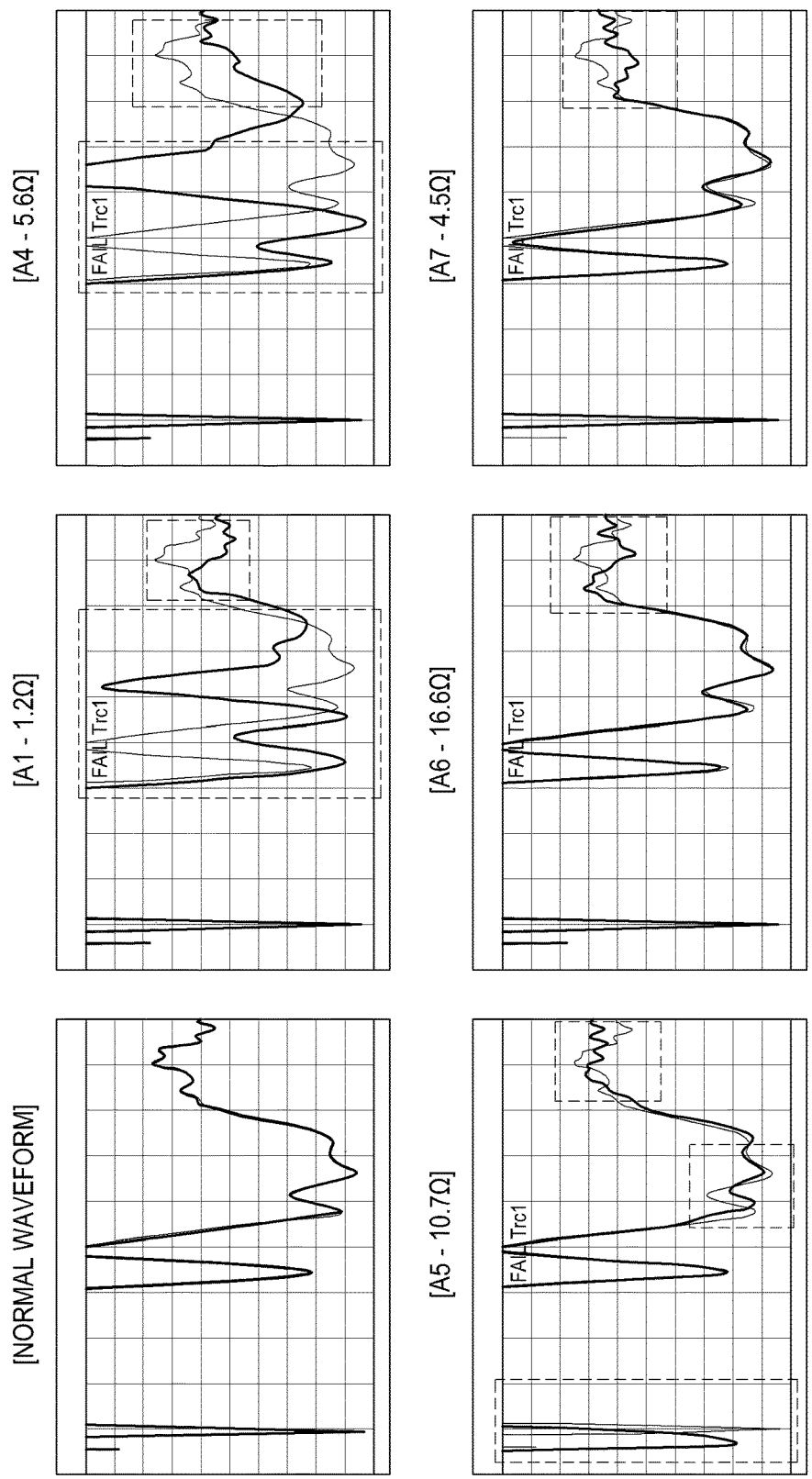
FIG. 11 illustrates graphs of detecting tests as to whether a cold solder failure exists in some connector pins of a connector device, in which the graphs are represented in the connector mounting failure detecting device according to various embodiments of the present disclosure.

FIG. 11 illustrates graphs of detecting tests as to whether a cold solder failure exists in some connector pins 310 of a connector device, in which the graphs are represented in the connector mounting failure detecting device 10 according to various embodiments of the present disclosure.

Figure 12A:
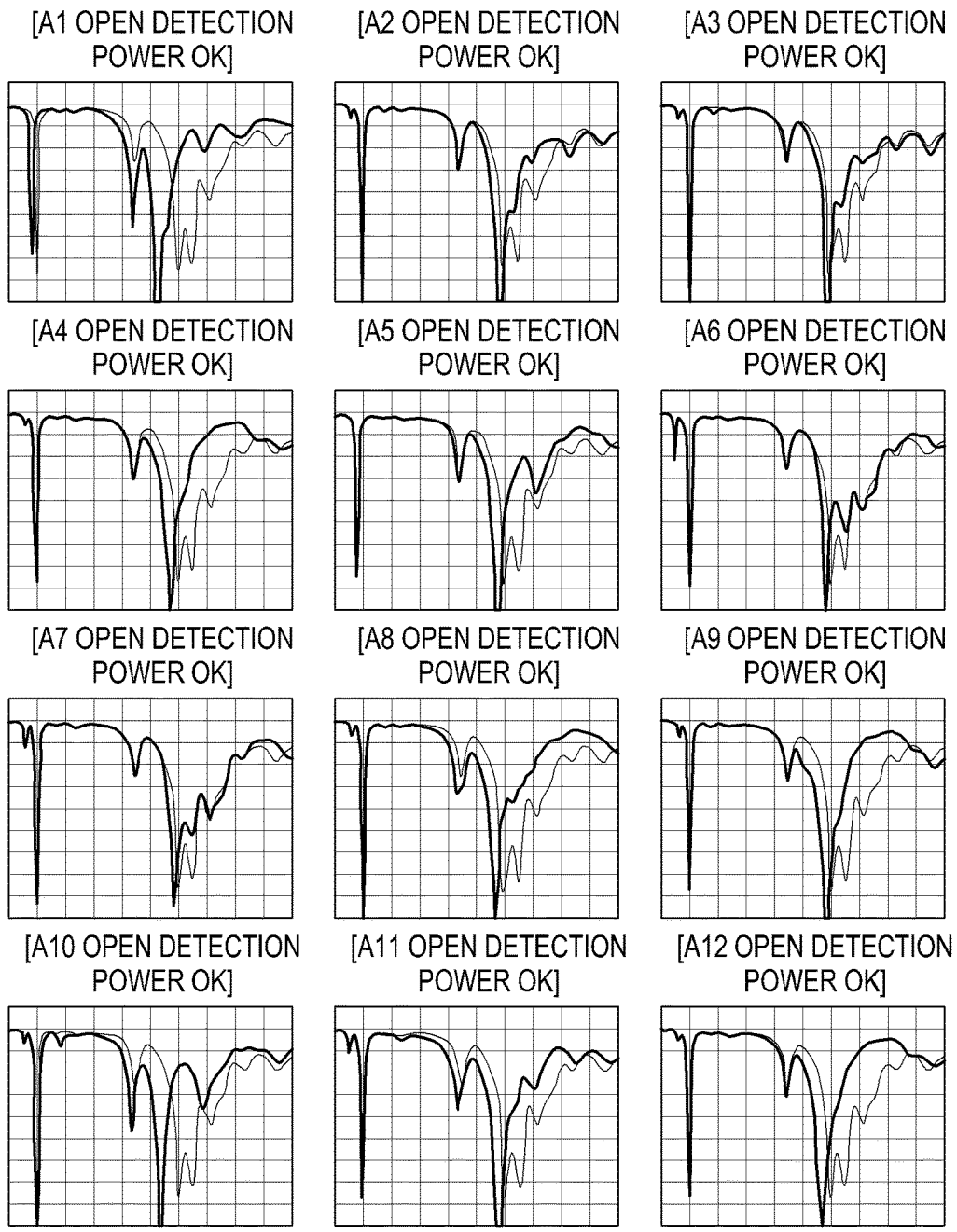
FIG. 12A illustrates graphs representing an open failure detected in the respective connector pins of a first row in the connector mounting failure detecting device according to various embodiments of the present disclosure.
Figure 12B:
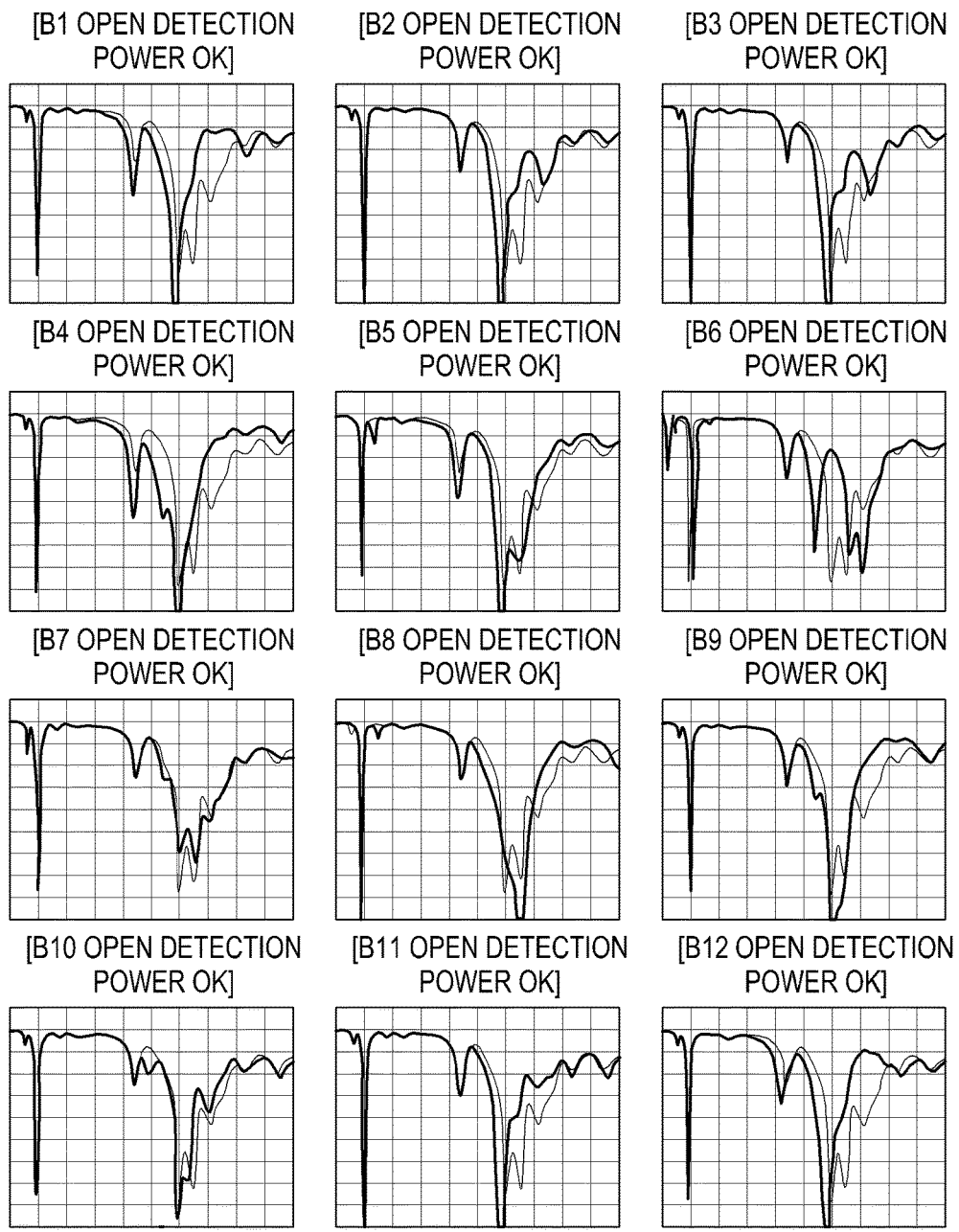
FIG. 12B illustrates graphs representing an open failure detected in the respective connector pins of a second row in the connector mounting failure detecting device according to various embodiments of the present disclosure.

FIGS. 12A and 12B illustrate graphs representing an open failure detected from the respective connector pins 310 of first and second rows in the connector mounting failure detecting device 10 according to various embodiments of the present disclosure.

Referring to FIGS. 7 to 12B, when the connector device 300 is connected to the connector 420 on the jig 100, the respective pins 421 and 422 of the connector 420 (see figures together with FIGS. 5A and 5B) may be electrically connected to the connector pins 310 of the connector device, respectively. Thus, signals depending on whether the pins 421 and 422 of the connection connector 420 are connected to the connector pins 310 may be applied to the detection unit 200 through the connection member 400.

In addition, as illustrated in FIG. 11, when respective connection pins are detected, measured waveforms (the relatively thin lines) may be obtained in comparison to the normal waveforms (the relatively thick lines) of the reference waveforms. By comparing the measured waveforms detected for the respective connection pins with the normal waveforms that serve as reference waveforms, it is possible to detect at least one of a lead bent failure, an open failure, an insufficient solder failure, a lead bending failure, a cold solder failure, or a crack.

The detection unit 200 can visually display a measured waveform corresponding to a value detected according to a signal. Further, the detection unit 200 can display a measured waveform in comparison with a reference waveform that is obtained when a connector device is normally coupled. Thus, depending on whether the measured waveform and the reference form is coincident with each other, it is possible to detect whether the connector pins of the connector device are mounted, for example, whether the connector pins 310 are normally coupled to the circuit board 320, or whether the connector pins 310 are coupled to the circuit board 320 in a state of including at least one of a lead bending failure, an open failure, an insufficient solder failure, a lead bent failure, a cold solder failure, or a crack.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A device for detecting a connector mounting failure, the device comprising:
a detection unit;
a connection member that interconnects the detection unit and a connector device; and
a connector seating jig including a connector fixing unit on which the connector device is fixed or seated and a sliding fixing unit movable with respect to the connector fixing unit, wherein the connector fixing unit is provided with a seating recess and the sliding fixing unit is provided with a stopper protrusion,
wherein the connection member comprises:
a connection connector fixed to the sliding fixing unit, and configured to be inserted into and to be seated in the connector device, and
a connection line unit that interconnects the connection connector and the detection unit, and delivers a detection value of the connection connector to the detection unit,
wherein on a position of the sliding fixing unit where the stopper protrusion is seated in the seating recess, the connection connector is electrically connected to the connector device and a movement of the sliding fixing unit with respect to the connector fixing unit is restricted, and
wherein the connector device comprises a circuit board and a connector pin soldered to the circuit board, and the detection unit is configured to detect a soldered state of the connector pin in relation to the circuit board.

2. The device of claim 1, wherein the connection connector is fixed to protrude from one end of the sliding fixing unit toward the connector device.

3. The device of claim 1, wherein the stopper protrusion protrudes in a sliding direction of the sliding fixing unit.

4. The device of claim 1, wherein the detection unit detects a mounting failure by comparing a measured waveform of a signal that is incident on the connector device and then returns a reference waveform to the detection unit through the connection member.

5. The device of claim 1, wherein the connector device is a USB type C connector.

6. The device of claim 1, wherein the detection unit is configured to detect at least one of a lead bending failure, an open failure, a cold solder failure, an insufficient solder failure, or a crack that is caused when the connector pin is coupled to the circuit board.

7. A device for detecting a connector mounting failure, the device comprising:
a connector seating jig including a connector fixing unit on which a connector device is fixed or seated and a sliding fixing unit movable with respect to the connector fixing unit, wherein the connector fixing unit is provided with a seating recess and the sliding fixing unit is provided with a stopper protrusion;
a detection unit coupled to the connector device to deliver a signal to the connector device; and
a connection member that interconnects the detection unit and the connector device and comprises a connection connector fixed to the sliding fixing unit and configured to be inserted into and to be electrically connected to the connector device, and a connection line unit that interconnects the connection connector and the detection unit,
wherein on a position of the sliding fixing unit where the stopper protrusion is seated in the seating recess, the connection connector is electrically connected to the connector device and a movement of the sliding fixing unit with respect to the connector fixing unit is restricted, and
wherein the connector device comprises a circuit board and a connector pin soldered to the circuit board, and the detection unit is configured to detect a soldered state of the connector pin in relation to the circuit board.

8. The device of claim 7, wherein the connector seating jig comprises:
a jig body;
where the connector fixing unit is provided on the jig body; and
the sliding fixing unit is provided on the jig body adjacent to the connector fixing unit and slidingly moves on the jig body.

9. The device of claim 8, wherein the stopper protrusion protrudes in a sliding direction of the sliding fixing unit.

10. The device of claim 7, wherein the detection unit detects a mounting failure by comparing a measured waveform of a signal that is incident on the connector device and then returns a reference waveform to the detection unit through the connection member in a state where the connector device and the connection line unit are coupled to each other.

11. The device of claim 7, wherein the detection unit is configured to detect at least one of a lead bending failure, an open failure, a cold solder failure, an insufficient solder failure, or a crack that is caused when the connector pin is coupled to the circuit board.

* * * * *